United States Patent [19]

Ristow

[11] Patent Number: 5,298,444
[45] Date of Patent: Mar. 29, 1994

[54] METHOD FOR MANUFACTURING A FIELD EFFECT TRANSISTOR

[75] Inventor: Dietrich Ristow, Neubiberg, Fed. Rep. of Germany

[73] Assignee: Siemens Aktiengesellschaft, Munich, Fed. Rep. of Germany

[21] Appl. No.: 52,549

[22] Filed: Apr. 26, 1993

[30] Foreign Application Priority Data

May 14, 1992 [DE] Fed. Rep. of Germany ....... 4125985

[51] Int. Cl.$^5$ ........................................... H01L 21/265
[52] U.S. Cl. ...................................... 437/40; 437/203;
257/213
[58] Field of Search ................. 437/40, 187, 203, 909,
437/912, 41; 257/213

[56] References Cited

U.S. PATENT DOCUMENTS

| 4,196,439 | 4/1980 | Niehaus et al. | |
|---|---|---|---|
| 4,300,148 | 11/1981 | Niehaus et al. | |
| 4,910,170 | 3/1990 | Motozima et al. | 437/22 P |
| 4,956,308 | 9/1990 | Griffin et al. | |
| 5,024,957 | 6/1991 | Harame et al. | 437/31 |
| 5,108,939 | 4/1992 | Manky et al. | 437/43 |
| 5,155,052 | 10/1992 | Davies | 437/40 |
| 5,208,177 | 5/1993 | Lee | 437/47 |
| 5,240,869 | 8/1993 | Nakatani | 437/41 |

FOREIGN PATENT DOCUMENTS

| 0439114 | 7/1991 | European Pat. Off. . |
|---|---|---|
| 0443348 | 8/1991 | European Pat. Off. . |
| 4211051 | 4/1992 | Fed. Rep. of Germany . |
| 61-231770 | 10/1986 | Japan . |

OTHER PUBLICATIONS

K. Steiner, et al., IEEE Transactions on Electron Devices, vol. 38, No. 8, Aug. 1991, "Minimum-Size Effects in Asymmetric Tilt-Angle-Implanted LLD-WN$_x$-GaAs MESMFET's".

T. Enoki, et al., IEEE Transactions on Electron Devices, vol. 37, No. 4, Apr. 1990, "Characteristics Including Electron Velocity Overshoot for 0.1-$\mu$-m-Gate-Length GaAs SAINT MESFETs".

Primary Examiner—Olik Chaudhuri
Assistant Examiner—Richard A. Booth
Attorney, Agent, or Firm—Hill, Steadman & Simpson

[57] ABSTRACT

A method for manufacturing a field effect transistor which includes one more spacer provided in the gate recess adjacent the drain sidewall than adjacent the source sidewall in the contact such that a gate metallization is displaced asymmetrically toward a source side sidewall of the recess; and method for manufacturing same wherein oblique vapor deposition of an auxiliary layer into a recess for the gate region makes it possible for a spacer therein at the source side to be removed whereas a spacer of the drain side remains in place, such that the subsequent gate metallization is positioned closer to the source than to the drain.

10 Claims, 3 Drawing Sheets

METHOD FOR MANUFACTURING A FIELD EFFECT TRANSISTOR

BACKGROUND OF THE INVENTION

The present invention generally relates to methods for manufacturing field effect transistors (FETs). More specifically, the invention relates to the manufacture of FETs having extremely short gate lengths.

In field effect transistors, particularly MESFETs or HEMTS, the spacing between the gate and the contact layer should be kept short at the source side so that the parasitic source resistance is kept low. On the other hand, the spacing between the gate and the contact layer should be relatively large at the drain side, so that the breakdown voltage between the gate and the drain is adequately high and the gate-drain capacitance is optimally low at the same time.

Up to now, self-aligning manufacturing methods were utilized for addressing these issues when the required breakdown voltage was not excessively high. The spacing between the gate and the $n^+$ contact layer thereby remained the same at the source and drain sides (i.e., symmetrical position of source and drain around the gate).

For higher breakdown voltages, the spacing to the contact layer was enlarged at the drain side with an additional phototechnique adjustment step. For example, U.S. Pat. Nos. 4,196,439 and 4,956,308, incorporated herein by reference, disclose such methods. It is proposed in U.S. Pat. No. 4,300,148, also incorporated herein by reference, to make the thickness of the active layer at the drain side of the gate so thin or, respectively, to make it so lightly doped that it can just accept (or absorb) the maximum of the possible current under the gate.

SUMMARY OF THE INVENTION

The present invention provides a field effect transistor having a high breakdown voltage and a low gate-drain capacitance and an easily implemented method for the manufacture of same.

To this end, in an embodiment, the invention provides a field effect transistor having a gate recess formed in a contact layer overlying a gate layer, a gate metallization filling the recess, and one more spacer is provided adjacent a drain side sidewall of the recess than is provided adjacent a source side sidewall such that the gate metallization is asymmetrically displaced toward a source side sidewall of the recess.

Further, in an embodiment, the invention provides a method for manufacturing a field effect transistor wherein:

a substrate having at least a gate layer and a contact layer is provided;

a recess in a gate region is provided in the contact layer between source and drain regions, the recess having source side and drain side sidewalls;

one more spacer is provided in the recess adjacent the drain side sidewall than is provided adjacent the source side sidewall; and the recess is filled with a gate metallization such that the spacer in the recess displaces the metallization asymmetrically toward the source side sidewall.

In an embodiment the invention provides a method for manufacturing a field effect transistor, comprising the steps of:

(a) providing a substrate having a gate layer and a contact layer thereover;

(b) applying a mask having an opening over the substrate and positioning the opening over a region where a gate for the transistor is to be formed;

(c) producing a recess in this region in at least the contact layer;

(d) producing spacers at source and drain sides of the recess;

(e) removing only the spacer at the source side in the recess;

(f) producing further spacers at the source and drain sides of the recess;

(g) applying a gate metallization between these further spacers and on the channel layer, such that the gate metallization is electrically insulated from the contact layer by these further spacers; and (h) producing metallizations for a source and a drain for the transistor.

In an embodiment, the invention provides the steps of:

generating an auxiliary layer between steps (c) and (d) that is present in the recess only at the source side;

producing in the spacer at the source side in step (d) on this auxiliary layer; and removing in step (e) the auxiliary later and the spacer at the source side.

In an embodiment, tile invention provides the steps of:

generating an auxiliary layer between steps (d) and (e) that covers only the spacer at the drain side, this auxiliary layer comprising a material with respect to which the spacer of the source side can be selectively removed; and removing the auxiliary layer between the steps (e) and (f).

In an embodiment of the invention, the auxiliary layer is applied from a direction that is inclined with respect to perpendicular on a plane defining the orientation of the layer sequence.

In an embodiment of the invention, the auxiliary layer is applied from a direction that is inclined with respect to perpendicular on a plane defining the orientation of the layer sequence.

In an embodiment of the invention, the auxiliary layer is made of metal.

In an embodiment of the invention, the auxiliary layer is made of metal.

In an embodiment, the invention provides the further step of producing a second recess in the channel layer before undertaking the step (f).

In an embodiment of the invention, the dimensions of the opening in the mask of the spacer of the drain side and of the further spacer are such that a gate length as measured along a contact surface between the gate metallization and the channel layer in the direction from source to drain, amounts to a maximum of 0.4 μm.

These and other features of the invention are discussed below in the following detailed description of the presently preferred embodiments with reference to the accompanying drawings.

DETAILED DESCRIPTION OF THE PRESENTLY PREFERRED EMBODIMENTS

Figure 1:
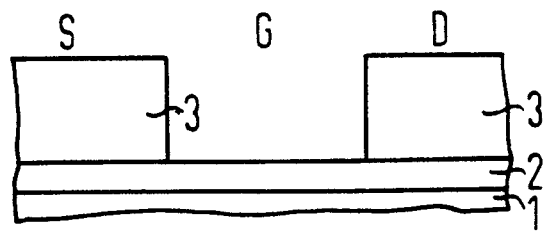
FIG. 1 illustrates a structure employed in manufacturing an FET by means of a method embodying principles of the invention.

The present invention provides one or more manufacturing steps by which a field effect transistor having a high breakdown voltage yet a low gate-drain capacitance can be made. Various intermediate structures arising during the manufacture of such an FET are illustrated in the drawings and reference should be made to the drawings in following the description set forth below.

As will become clearer below, only one phototechnique step is undertaken in one embodiment of the method of the invention in order to obtain an asymmetrical spacing of the gate from the contact layer source and drain sidewalls, i.e., the source and drain ends of the contact layer, in order to simultaneously produce an additional etched step (double recess) in the transition to the contact layer at the drain side. Proceeding on the basis of a light-optical lithography, an effective gate length of 0.2 μm can also be produced.

With reference to FIG. 1, it can be appreciated that there initially is formed at the beginning of the manufacturing process, a substrate having at least one semiconductor material layer 1 provided for an FET gate and a highly doped contact layer 2 thereon for source and drain regions. In the figures, the source is respectively shown at the left and the drain is respectively shown at the right, as indicated in FIG. 1 with the letters S (source), G (gate) and D (drain). This applies to all of the figures.

These layers 1 and 2 form a layer sequence and can be epitaxially grown on a semiconductor substrate of, for example, GaAs. The layers 1 and 2 can also be produced in a wafer by ion implantation.

In an ion-implanted MESFET, the sequence of layers 1 and 2 is composed of a channel layer and of a highly doped contact layer above one another, for example on a semi-insulating GaAs substrate. The channel layer and the contact layer can likewise be made of GaAs.

In an epitaxially grown HEMT, the layer sequence can, for example, be a buffer layer on a semi-insulating substrate that is very lightly doped or not doped at all, a further layer thereon forming a heterojunction, an intermediate layer thereon and, finally, a highly doped contact layer. For example, the substrate can be made of GaAs, as can be the buffer layer and the contact layer. The layer forming the heterojunction can be made, for example, of AlGaAs. The intermediate layer applied thereon can be made of AlGaAs. These layer sequences are only recited as one example; other layer sequences standard for field effect transistors can be produced just as easily. In every exemplary embodiment described herein, the layer 1 shown in the figures indicates the layer or layer sequence arranged between the substrate and the contact layer.

As also illustrated in FIG. 1, a mask 3 is applied on this layer sequence. For example, this can be accomplished by surface-wide application of a dielectric passivation layer (for example, PCVD-SiN, 0.2 μm thick). Subsequently, an opening having, for example, a length between the source and drain regions S and D, respectively, of 0.6 μm is produced in this passivation layer 3 by means of a phototechnique. This dimensioning of 0.6 μm therefor is recited for the direction in which the source, gate and drain lie in the finished FET. Since the layers of semiconductor material on which this passivation layer 3 was applied are still completely planar, the conditions of the photolithography should be such that this dimensioning occurs with the least possible scatter. Because of this and because of the easy reproducibility of the conditions under which the following method steps are implemented, the method of the invention can always be repeated and is suitable for producing high quantities of practically identical FETS. For example, the opening in the passivation layer can be etched with $CF_4$-RIE.

Figure 2:
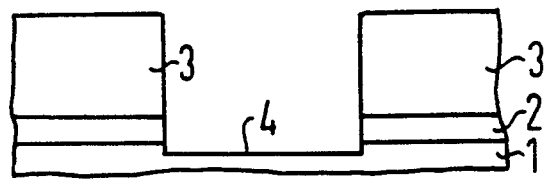
FIG. 2 illustrates the structure of FIG. 1 after a recess is formed in the gate region thereof in accordance with the invention.

As illustrated in FIG. 2, a recess 4 is subsequently etched in the bottom of the opening of this mask 3, i.e., the contact layer 2, with, for example, Cl-RIE. The contact layer 2 is thereby partially or entirely removed in the region of this opening 4 and, potentially, is also etched down into the layer 1, depending on what the layer thicknesses, the current and the cutoff voltage of the appertaining transistor require. For example, this recess 4 could have a depth of 100 nm. The result of this method step is shown in FIG. 2.

Figure 3:
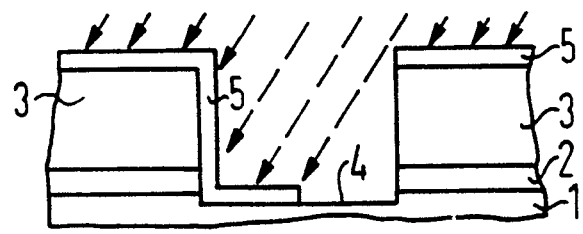
FIG. 3 illustrates an oblique vapor deposition step employed to form a removable auxiliary layer.

In a first exemplary embodiment of the method of the invention, an auxiliary layer 5 is asymmetrically applied at the source side by oblique vapor-deposition, as shown in FIG. 3. For example, metal (aluminum is particularly suitable) is vapor-deposited as this auxiliary layer 5. Given the dimensions recited up to now, the auxiliary layer can, for example, be 50 nm thick and the vapor deposition can ensue at an angle of approximately 45° relative to the plane of the layer. What is thus achieved is that the auxiliary layer 5 covers the surface of the layer 1 in the region of the recess 4 only at the source side. The vapor-deposition of the auxiliary layer 5 is indicated with the obliquely angled arrows in FIG. 3.

Figure 4:
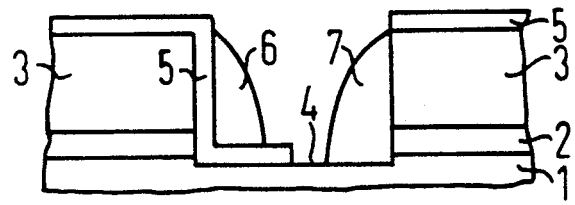
FIG. 4 illustrates formation of sidewall spacers in the recess following the step of FIG. 3.

In a further method step illustrated in FIG. 4, spacers 6 and 7 are produced in the opening 4 at the source side and at the drain side, this potentially ensuing with one of the standard methods as disclosed, for example, in German Patent Application P 42 11 051.3, the disclosure of which is incorporated herein by reference. For example, these spacers can be of SiN and have a width at the low end of approximately 0.2 μm as measured in the plane of the drawing of the drawing of FIG. 4.

The thickness of each of the spacers 6 and 7 is thereby selected such that the spacer 6 of the source side is seated only on the auxiliary layer 5. The thickness of this auxiliary layer 5 and the direction from which it is vapor-deposited are therefore also to be set in the preceding method step in view thereof that the subsequently produced spacer 6 of the source side must have adequate space on the part of the auxiliary layer 5 at the source side. The structure illustrated in FIG. 4 is achieved after this step.

Figure 5:
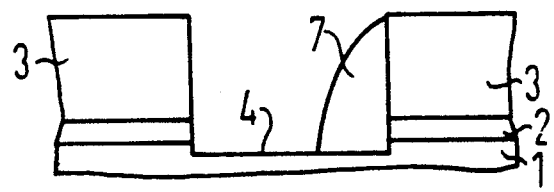
FIG. 5 illustrates the structure resulting after removal of the spacer formed in the step of FIG. 4 adjacent the source.

Then, as illustrated in FIG. 5, the spacer 6 at the source side then is removed because the auxiliary layer 5 is removed. When the auxiliary layer 5 is aluminum, it can be removed, for example, with liquid HCl (hydrochloric acid). Only the spacer 7 at the drain side then remains, as shown in FIG. 5.

Figure 6:
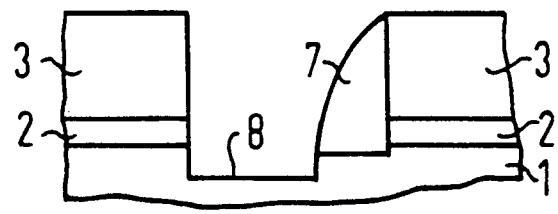
FIG. 6 illustrates the structure resulting after formation of a further recess in the gate region follows the step of FIG. 5.
Figure 7:
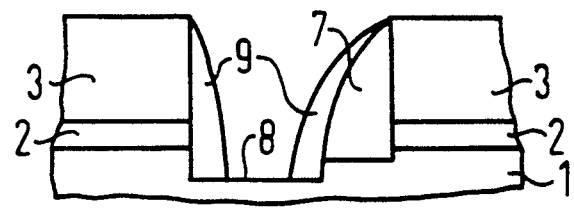
FIG. 7 illustrates formation of further spacers following the step of FIG. 6.

As illustrated in FIGS. 6 and 7, further spacers 9 can then be produced on that portion of the layer 1 that is left exposed after the steps discussed above. By first etching a second recess 8 into the layer 1, it is possible to more precisely define the cutoff voltage of the transistor (see FIG. 6). In order to assure that this second recess 8 is etched down to a prescribed depth, the layer 1 can contain a layer sequence having a suitable etch stop layer. This etch stop layer is then arranged at that level of the layer sequence down to which the etching of the second recess 8 should ensue. The cutoff voltage of the transistor then can be defined with extremely good reproducibility in this way.

FIG. 7 illustrates a cross section through the FET after the manufacture of the further spacers 9 on the surface of the layer 1 having the second recess 8.

Figure 9:
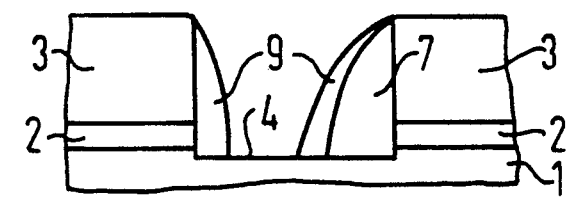
FIG. 9 illustrates the alternate structure resulting if further spacers are formed in the recess in the gate region following the step illustrated in FIG. 5.

An alternative structure without the second recess 8 is illustrated in FIG. 9. In particular, the further spacer 9 at the source side of the recess insulates the contact layer 2 on the source side from a gate metallization to be subsequently applied. The further spacers 9 preferably are made of he same material as the first spacer (for example, SiN).

In the present exemplary embodiments, these further spacers 9 are produced, for example, with a width of 0.1 μm at the low end, i.e., on the channel layer 1. When the respective dimensions of the spacers at the low ends are subtracted from the length of 0.6 μm for the mask opening, a gate length of 0.2 μm results, i.e., the length of the surface of the layer 1 in the direction from source to drain to be provided with the gate metallization. An extremely short gate length of 0.2 μm given a simultaneously asymmetrical alignment of the gate with reference to source and drain is thus realized.

Figure 8:
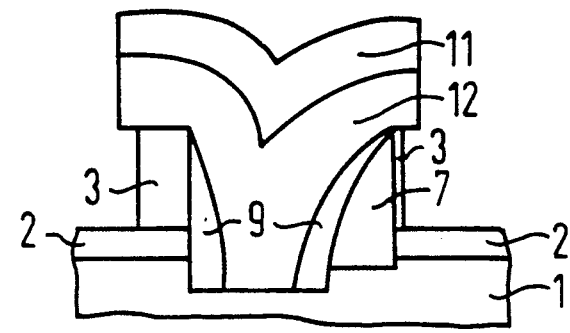
FIG. 8 illustrates formation of metallization layers following the step of FIG. 7.
Figure 10:
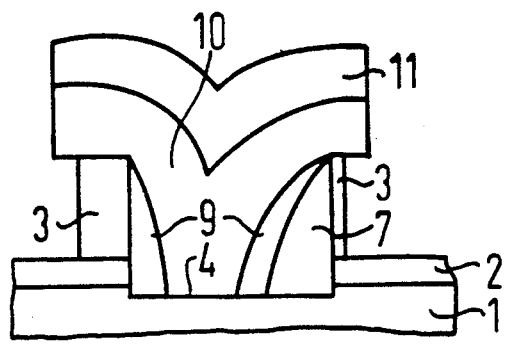
FIG. 10 illustrates the structure resulting after formation of metallization layers following the step illustrated in FIG. 9.

Subsequently, a gate metallization 10 (FIG. 10) or 12 (FIG. 8) and a gate reinforcement 11 are applied, whereby the gate reinforcement 11 simultaneously serves as an etching mask for structuring the gate metallization 8, 10 or 12. When etching the mask 3, the gate metallization 10 or 12 is slightly undercut, so that the metallizations for the source and drain can be applied, as is known from traditional manufacturing methods. The alternate results after the re-etching of the mask 3 down to portions at the source side and the drain side are shown in FIG. 8 and FIG. 10 (the alternate example without a second recess 8).

Care should be exercised in the alignment of the gate reinforcement 11 at the drain side to ensure that the reinforcement does not project over the contact layer 2 to an unnecessarily great extent, so that the drain/gate capacitance remains low. For this reason, the gate reinforcement 11 is shown asymmetrically relative to the two edges of the contact layer 2 in FIG. 8 or, respectively, in FIG. 10, even though this is not critical for the method of the invention.

Figure 11:
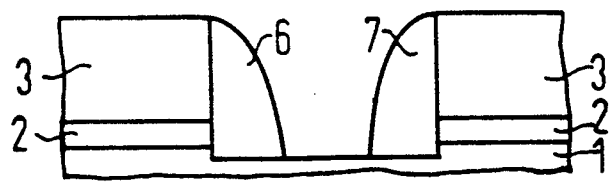
FIG. 11 illustrates an alternate method wherein formation of sidewall spacers in the structure of FIG. 2 occurs without prior formation of a removable auxiliary layer.
Figure 12:
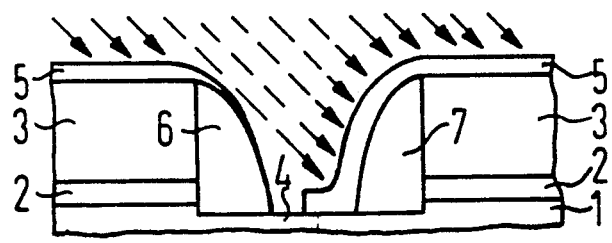
FIG. 12 illustrates oblique angle vapor deposition of an auxiliary layer on the structure of FIG. 11.

A second exemplary embodiment of the invention wherein the auxiliary layer 5 is employed as an etching mask shall be set forth below. In this version, the method steps that are described above and shown in FIGS. 1 and 2 are implemented in the same way as in the first exemplary embodiment. But, after these steps, the auxiliary layer 5 is not immediately applied; rather, the spacers 6 and 7 are first produced on the channel layer 1 as illustrated in FIG. 11. The auxiliary layer 5, which can again be, for example, made of metal, particularly aluminum, is then vapor-deposited at an oblique angle, from the direction of the source. This application of the auxiliary layer 5 ensues such that the spacer 7 at the drain side is completely covered by this auxiliary layer 5, as illustrated in FIG. 12. In this second exemplary embodiment, the auxiliary layer 5 can be thicker than that layer 5 in the first embodiment, for example, 150 μm thick.

Figure 13:
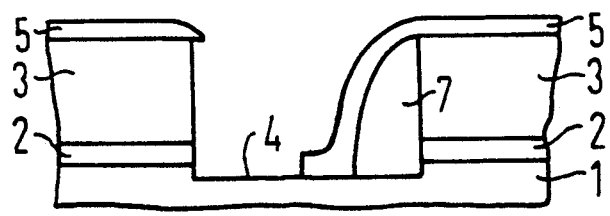
FIG. 13 illustrates the structure resulting following removal of the source sidewall spacer from the structure of FIG. 12.

Thereafter, the spacer 6 at the source side is removed in a further step, for example, ed with $CF_4$-RIE. The material of the auxiliary layer 5 thereby serves as an etching mask that protects the spacer 7 at the drain side. It can be appreciated that a certain degree of damage to the crystal structure at the surface of the semiconductor material at the source side (surface-proximate crystal damage) by the RIE can be accepted since the surface layer of the layer 1 thereby affected can be etched off in a following step, when producing a second recess. After the auxiliary layer 5 has been removed, which, for example, can be done with HCl if aluminum is used for the layer 5, the arrangement of FIG. 13 results. The method steps following thereupon then correspond to those of FIGS. 6 through 8 or, respectively, 9 and 10.

As can be appreciated from the foregoing, what is critical in the described embodiments of the invention is that one more spacer or a larger spacer width is produced at the drain side of the recess or opening formed in the layers 2 and 3 than is produced at the source side of the recess openings; what is thereby achieved is that the gate metallization is positioned displaced toward the source side. This method is particularly advantageous when transistors having extremely short gate lengths are to be produced (for example for high frequencies). The most noticeable improvements over the prior art are achieved therewith, for instance, for gate lengths up through 0.4 μm; however, it can also be employed for larger dimensions. Although modifications and changes may be suggested by those skilled in the art, it is the intention of the inventors to embody within the patent warranted hereon all changes and modifications as reasonably and properly come within the scope of their contribution to the art.

I claim:

1. A method for manufacturing a field effect transistor, comprising the steps of:
   (a) providing a substrate having a gate layer and a contact layer thereover;

(b) applying a mask having an opening over the substrate and positioning the opening over a gate region where a gate for the transistor is to be formed between source and drain regions;

(c) producing a recess in the gate region in that at least the thickness of the contact layer is reduced thereat, the recess having source and drain sides;

(d) producing spacers at source and drain sides in the recess;

(e) removing the spacer at the source side in the recess;

(f) producing further spacers at sides of the recess;

(g) applying a gate metallization between these further spacers and on the channel layer, such that the gate metallization is electrically insulated from the contact layer by these further spacers; and (h) producing metallizations for a source and a drain for the transistor.

2. The method of claim 1, comprising the further steps of:

generating an auxiliary layer between steps (c) and (d) that is present in the recess only at the source side;

producing in steps (d), spacer of the source side on this auxiliary layer; and removing in step (e) the auxiliary later and the spacer of the source side.

3. The method of claim 1, comprising the further steps of:

generating an auxiliary layer between steps (d) and (e) that covers only the spacer at the drain side, this auxiliary layer being composed of a material with respect to which the spacer of the source side can be selectively removed; and removing the auxiliary layer between the steps (e) and (f).

4. The method of claim 2, whereby the auxiliary layer is applied from a direction that is inclined with respect to perpendicular on a plane defining the orientation of the layer sequence.

5. The method of claim 3, whereby the auxiliary layer is applied from a direction that is inclined with respect to perpendicular on a plane defining the orientation of the layer sequence.

6. The method of claim 2 wherein the auxiliary layer is made of metal.

7. The method of claim 3, wherein the auxiliary layer is made of metal.

8. The method of claim 1, comprising the further step of producing a second recess in the channel layer before the step (f).

9. The method of claim 1, wherein the dimensions of the opening in the mask of the drain side and of the further spacer are such that a gate length as measured along a contact surface between the gate metallization and the channel layer in the direction from source to drain, amounts to a maximum of 0.4 $\mu$m.

10. A method of forming a field effect transistor, comprising the steps of:

providing a substrate having an upper layer sequence of at least a gate layer and a contact layer thereover;

providing a recess through the contact layer to the gate layer in a gate region lying between a source region and a drain region;

providing in the recess one more spacer adjacent a sidewall of the drain region than adjacent a sidewall of the source region; and producing a metallization layer filing the recess to form a gate.

* * * * *